United States Patent [19]
Kamei

[11] Patent Number: 5,939,950
[45] Date of Patent: Aug. 17, 1999

[54] VOLTAGE CONTROLLED OSCILLATOR HAVING A CONTROLLABLE DUTY CYCLE

[75] Inventor: Takahiro Kamei, Tokyo, Japan

[73] Assignee: Oki Electric Industry Co., Ltd., Tokyo, Japan

[21] Appl. No.: 08/965,411

[22] Filed: Nov. 6, 1997

[30] Foreign Application Priority Data

Feb. 7, 1997 [JP] Japan .................................. 9-025225

[51] Int. Cl.$^6$ ...................................................... H03B 5/00
[52] U.S. Cl. ............................ 331/57; 331/175; 331/74; 327/175; 327/393
[58] Field of Search .......................... 331/57, 175, 177 R, 331/74; 327/175, 176, 393, 394

*Primary Examiner*—Arnold Kinkead
*Attorney, Agent, or Firm*—Rabin & Champagne, P.C

[57] ABSTRACT

The voltage controlled oscillator comprising a ring oscillator generates an oscillating signal of which the duty cycle is almost 50% in spite of providing a high frequency signal. Each of the delay inverting circuits in the ring oscillator increases the output signal from the "L" level to the "H" level over the constant delay time tr when the input signal transitions from the "H" level to the "L" level. It also decreases the output signal from the "H" level to the "L" level over the variable delay time tf in response to the delay control voltage Vc when the input signal transitions from the "L" level to the "H" level. The output signal from the ring oscillator comprising the delay inverting circuits is applied to another delay inverting circuit. The other delay inverting circuit responds over at the constant delay time tr when the input signal transitions from the "H" level to the "L" level, and responds over at the delay time tf/2 in accordance with the delay control voltage Vc when the input signal transitions from the "L" level to the "H" level. As a result, the other delay inverting circuit generates an oscillating signal having a duty cycle that almost 50%.

7 Claims, 5 Drawing Sheets

VOLTAGE CONTROLLED OSCILLATOR HAVING A CONTROLLABLE DUTY CYCLE

BACKGROUND OF THE INVENTION

1. Field of the Invention

The present invention relates to a voltage controlled oscillator (hereinafter, called VCO) which can control an oscillating frequency by connecting inverting logic circuits of an odd number in a ring and by controlling a delay time in each of the inverting logic circuits with a control voltage.

2. Description of the Related Art

FIG. 6 is a structural view illustrating a conventional VCO of a ring circuit.

The VCO is provided with three delay inverting circuits 1, 2, 3 connected in a ring. These delay inverting circuits 1–3 are logic circuits, each of which compares an input signal received at an input terminal A with a reference voltage Vr applied to an input terminal B and generates a signal of a logic level inverted in accordance with a compared result at an output terminal C. Each of the delay inverting circuits 1–3 is provided with a control terminal D, and controls a delay time of an output signal at an output terminal C with a delay control voltage Vc applied to the control terminal D. That is, each of the delay inverting circuits 1–3 is provided with an inverting circuit comparing the input signal with the reference voltage Vr and generating an inverted signal, and a delay circuit connected to an output of the inverting circuit. The delay circuit comprises a charge part which is a capacitor and a discharge part which is a transistor of which a continuity condition is controlled by the delay control voltage Vc.

The output of the delay inverting circuit 3 is connected to the input of the delay inverting circuit 1 and is provided to a logic gate 4 for wave forming. An oscillating signal OUT of which a waveform is shaped to be rectangular is generated at the output of the logic gate 4.

In this VCO, for example, when the input of the delay inverting circuit 1 is the level "L" at a time that power is supplied, after the delay time by the operation of the delay inverting circuits 1–3, a signal of the level "H" is generated by the output of the delay inverting circuit 3. Since this signal is fed back to the input of the delay inverting circuit 1, after the delay time by the further operation of the delay inverting circuits 1–3, the output of the delay inverting circuit 3 transitions to the "L" level. In this way, the oscillating operation of which a frequency is a ring delay time by the operation of the delay inverting circuits 1–3, is carried out.

Now, the following operation is carried out in each of the delay inverting circuits 1–3. That is, when the output signal from the inverting circuit transitions from the "L" level to the "H" level, the charge part in the delay circuit is charged in a constant short time and the output signal from the delay circuit becomes the "H" level. On the contrary, when the output signal from the inverting circuit transitions from the "H" level to the "L" level, the electric charges held in the charge part are discharged in accordance with a time constant of the discharge part in the delay circuit and the output voltage of the delay circuit lowers continuously. Then, the output signal becomes the "L" level after a time passes. The time constant is controlled by the delay control voltage Vc applied to the delay circuit in the delay inverting circuits 1–3 from the control terminal D, therefore, it is possible to control the oscillating frequency by the delay control voltage Vc.

However, there is a problem in the conventional VCO as follows.

That is, in the control of the oscillating frequency, the delay time, when the output signal in each of the delay inverting circuits 1–3 transitions from the "H" level to the "L" level, is controlled and the ring delay time is controlled, whereby the oscillating frequency is controlled. As to the oscillating signal, the time the signal is at the "H" level is longer than that at the "L" level. Therefore, it is impossible to keep a duty cycle at 50%. As a result, since the pulse width of the "L" level in the oscillating signal OUT becomes narrow, it is impossible to keep a setup time and a hold time for a flip-flop circuit or the like which is connected as a rear stage. Thus, it is caused that a malfunction occurs. Further, though it is possible to set the duty cycle close to 50% by incasing a number of the delay inverting circuits to be a ring, the ring delay time increases. Thus, for example, there is a problem that it becomes difficult to oscillate at a high frequency not less than 156 MHz used for high speed communication.

SUMMARY OF THE INVENTION

The present invention solves the above described problem in the conventional VCO and provides a VCO which can obtain an oscillating output of almost 50% duty cycle in spite of a high frequency.

To solve the above described problem, a voltage controlled oscillator of the present invention comprises at least four delay inverting circuits of an even number and controls an oscillating frequency. Each of the delay inverting circuits comprises an input terminal, a reference terminal, a control terminal, an inverting circuit, and a delay circuit.

The input terminal receives a signal of a level within a predetermined range. The reference terminal receives a reference signal of a value within the predetermined range. The control terminal receives a control signal.

The inverting circuit inverts the signal between the first logical level and the second logical level based on whether a logical level of the signal exceeds the reference signal or not.

The delay circuit receives the signal inverted by the inverting circuit and outputs the signal of which a level varies at a constant ratio within the predetermined range when the signal is inverted from the first logical level to the second logical level.

One of the delay inverting circuits of a last stage outputs the signal of which a level varies at a half of a variable ratio within the predetermined range in accordance with control signal when the signal is inverted from the second logical level to the first logical level.

Others of the delay inverting circuits are connected in a ring and respectively output the signal of which a level varies at the variable ratio within the predetermined range in accordance with the control signal when the signal is inverted from the second logical level to the first logical level.

The delay circuit in each of the delay inverting circuits connected in the ring may comprise a first charge part and a first discharge part (second aspect).

The first delay circuit is filled with electric charges by the signal of the second logical level inverted by the first inverting circuit and outputs the signal varying at the constant ratio.

The first discharge part is controlled by the control signal and discharges the electric charges filled in the first charge part in accordance with the control signal when the signal inverted by the first inverting circuit is the first logical level.

The delay circuit in one of the delay inverting circuits of the last stage may comprise a second charge part and a second discharge part (third aspect).

The second charge part is filled with electric charges by the signal of the second logical level inverted by the second inverting circuit and outputs the signal varying at the constant ratio or at a half of the variable ratio.

The second discharge part is controlled by the control signal and discharges the electric charges filled in the second charge part when the signal inverted by the second inverting circuit is the first logical level.

A capacity of the second charge part may be equal to that of the first charge part, and the second discharge part may discharge the electric charges in the second charge part at twice a speed of the first discharge part (fourth aspect).

A capacity of the second charge part may be a half of a capacity of the first charge part, and the second discharge part may discharge the electric charges in the second charge part at a speed equal to that in the first discharge part (fifth aspect).

According to the first-fifth aspects, the VCO is structured as above described, therefore, the VCO operates as follows.

In the first delay circuit of the delay inverting circuit in the ring oscillating circuit, a delay time from the first logical level to the second logical level is different from a delay time from the second logical level to the first logical level. Thus, the duty cycle of the output signal from the ring oscillator is out of 50%. The second inverting circuit inverts the logical level of the output signal from the ring oscillator, and the second delay circuit shortens the delay time from the second logical level to the first logical level to ½. Then, the signal of which the delay time is shorten is outputted. The delay time is corrected by the second inverting circuit and the second delay circuit, therefore, the duty cycle of the oscillating signal becomes close to 50%.

In a voltage controlled oscillator comprising at least four delay inverting circuits of an even number and controlling an oscillating frequency, one of the delay inverting circuits of a last stage may comprise a first inverting circuit inverting the signal between the first logical level and the second logical level within a half of the predetermined range based on whether a logical level of the signal exceeds the reference signal or not, and a first delay circuit receiving the signal inverted by the first inverting circuit and outputting the signal of which a level varies at a constant ratio within the half of the predetermined range when the signal is inverted from the first logical level to the second logical level and outputting the signal of which a level varies at a variable ratio within the half of the predetermined range in accordance with the control signal when the signal is inverted from the second logical level to the first logical level.

Each of others of the delay inverting circuits connected in a ring may comprise a second inverting circuit inverting the signal between a third logical level and a fourth logical level within the predetermined range based on whether a logical level of the signal exceeds the reference signal or not, and a second delay circuit receiving the signal inverted by the second inverting circuit and outputting the signal of which a level varies at the constant ratio within the predetermined range when the signal is inverted from the third logical level to the fourth logical level and outputting the signal of which a level varies at the variable ratio within the predetermined range in accordance with control signal when the signal is inverted from the fourth logical level to the third logical level (sixth aspect).

According to the sixth aspect, the VCO operates as follows.

The signal is outputted from the ring oscillator, and the output signal of which the logical level is inverted by the second inverting circuit and of which the output amplitude is restricted to ½ is applied to the second delay circuit. In the second delay circuit, the delay time is set in accordance with a variation of the logical level of the output signal of which the amplitude is ½, therefore, the delay time from the fourth level to the third level is shorten to a half (½) of the delay time from the second level to the first level. As a result, it is possible to put the duty cycle of the oscillating signal close to 50% similarly to the first-fifth aspects.

The present invention also provides a method of controlling a voltage controlled oscillator comprising with a ring oscillator provided with at least three delay inverting circuits of an odd number and a delay inverter connected to the ring oscillator.

In this method, a signal within a range is received. A reference signal of a value in the range is received. A control signal is received.

The signal is inverted between a first logical level and a second logical level within the range based on whether a logical level of the signal exceeds the reference signal or not in the ring oscillator.

The signal which is inverted is received and the signal of which a level varies at a constant ratio within the range is outputted from the ring oscillator when the signal is inverted from the first logical level to the second logical level and the signal of which a level varies at a variable ratio within the range in accordance with the control signal is outputted from the ring oscillator when the signal is inverted from the second logical level to the first logical level.

The signal outputted from the ring oscillator is received and the signal is inverted between the first logical level and the second logical level based on whether a logical level of the signal exceeds the reference signal or not in the delay inverter.

The signal of which a level varies at the constant ratio within the range is outputted when the signal is inverted from the first logical level to the second logical level, and the signal of which a level varies at a half of the variable ratio within the range in accordance with control signal is outputted when the signal is inverted from the second logical level to the first logical level.

BRIEF DESCRIPTION OF THE DRAWINGS

Other objects and advantages of the present invention will become apparent during the following discussion in conjunction with the accompanying drawings, in which.

DETAILED DESCRIPTION OF THE PREFERRED EMBODIMENTS

Preferred aspects and embodiments of the present invention will now be described with reference to the accompanying drawings.

<First Embodiment>

Figure 1:
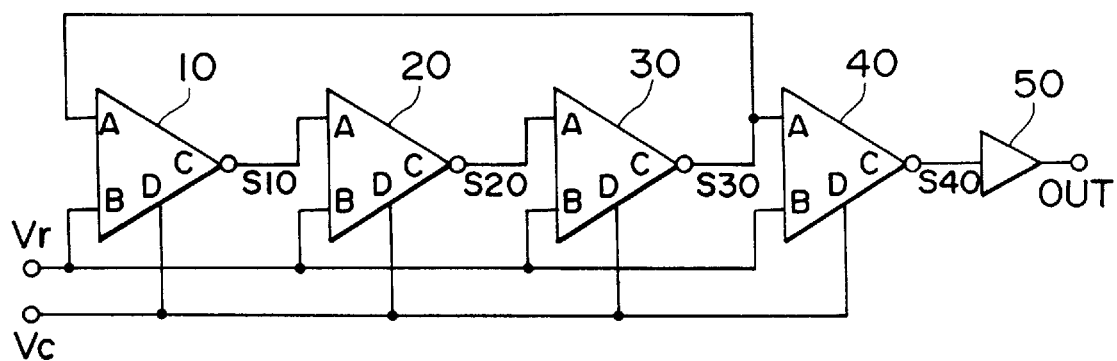
FIG. 1 is a structural view illustrating a VCO of the first embodiment according to the present invention.

FIG. 1 is a structural view illustrating a voltage controlled oscillator (VCO) of the first embodiment according to the present invention.

The VCO is provided with three delay inverting circuits 10, 20, 30 which are connected in a ring. These delay inverting circuits 10, 20, 30 are similar to one another, and each is provided with an inverting circuit inverting a logic level of an input signal Vi and a delay circuit connected to the output of the inverting circuit.

The inverting circuit is a logic circuit which compares the input signal Vi at an input terminal A with a reference voltage Vr applied to an input terminal B and which generates an inverted signal of a logic level which is inverted in accordance with the compared result. That is, in case of Vi≦Vr, the inverted signal of the "H" level is generated, and in case of Vi>Vr, the inverted signal of the "L" level is generated.

The delay circuit controls a delay time when the inverted signal generated by the inverting circuit is applied to the output terminal C. The delay circuit, when the inverted signal from the inverting circuit transitions from the "L" level to the "H" level, responds for a constant delay time tr (for example, tr=0.2 ns), and when the inverted signal transitions from the "H" level to the "L" level, responds for a variable delay time tf (for example, tf=1.6–4.0 ns), and then generates a delayed output signal from the output terminal C.

The output terminal C of the delay inverting circuit 30 is connected to the input terminal A of the delay inverting circuit 10 and is also connected to the input terminal A of the delay inverting circuit 40. The delay inverting circuit 40 is provided with a control terminal D, and the delay control voltage Vc which is used in common with the delay inverting circuits 10–30 is applied to the control terminal.

The delay inverting circuit 40 functions similarly to the delay inverting circuits 10, 20, 30, and is provided with an inverting circuit similar to that in the delay inverting circuit 10 and a delay circuit in which a delay time is set to be slightly different from that in the delay inverting circuit 10. That is, the delay circuit in the delay inverting circuit 40, when the inverted signal from the inverting circuit transitions from the "L" level to the "H" level, responds for the delay time tr similar to that in the delay inverting circuit 10. On the contrary, however, the delay circuit, when the inverted signal transitions from the "H" level to the "L" level, responds for a half of the variable delay time tf in the delay inverting circuit 10, that is, for tf/2 in accordance with the delay control voltage Vc, and generates the delayed output signal at the output terminal C.

The output terminal C in the delay inverting circuit 40 is connected to the input of the logic gate 50 for shaping a waveform, the oscillating signal OUT of which is a waveform shaped as a rectangular wave generated at the output of the logic gate 50.

Figure 2A:
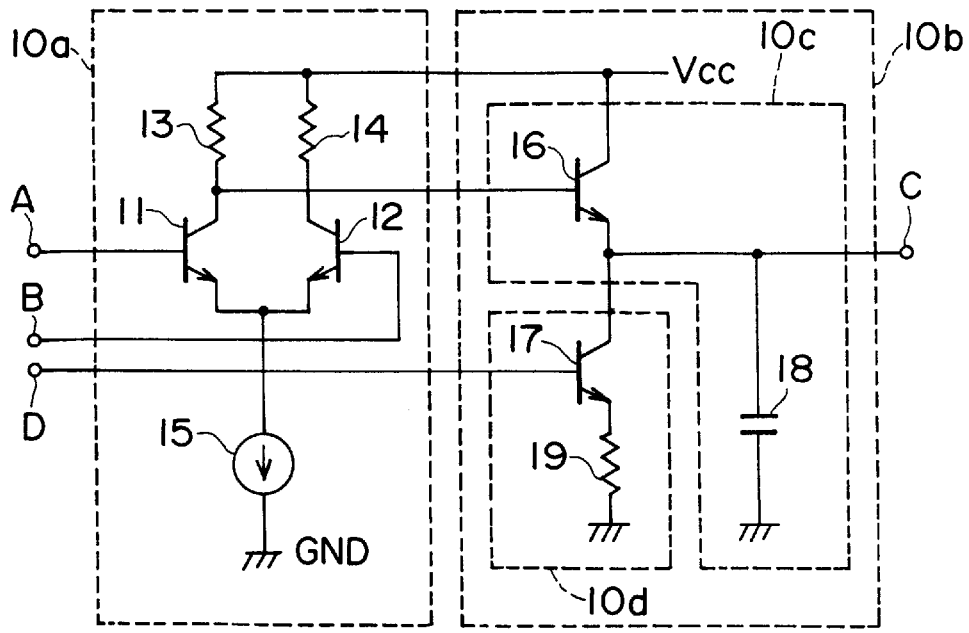
FIGS. 2(a) and 2(b) are circuit views illustrating delay inverting circuits 10, 40 in FIG. 1.
Figure 2B:
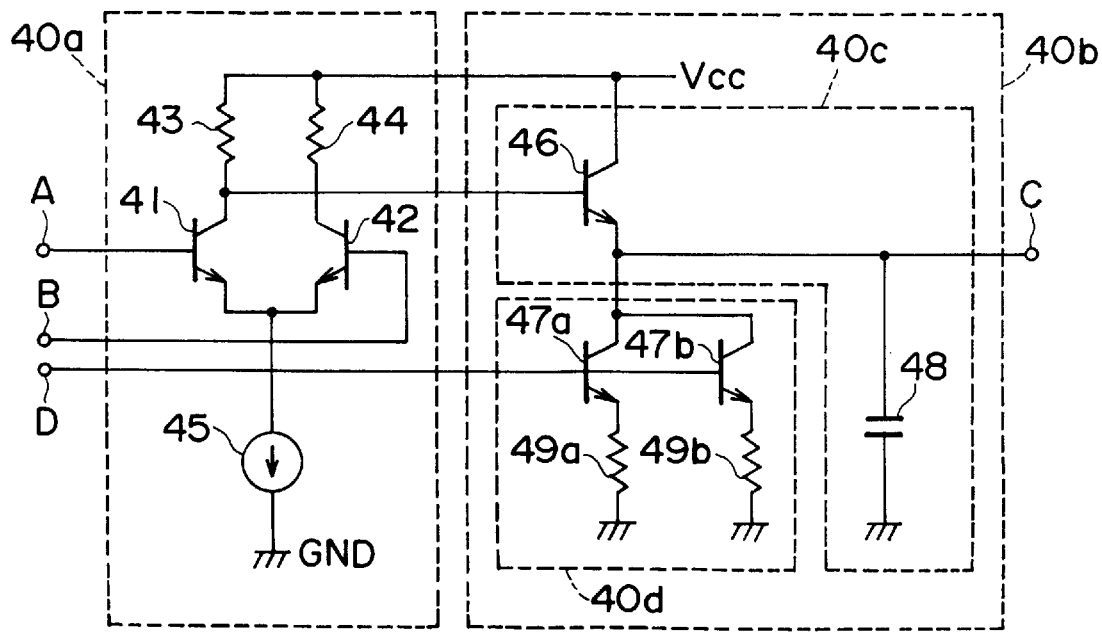

FIGS. 2(a) and 2(b) are views respectively illustrating delay inverting circuits 10, 40 shown in FIG. 1.

The delay inverting circuit 10, as shown in FIG. 2(a), is provided with an inverting circuit 10a comprising transistors 11, 12, resistances 13, 14, and a constant current source 15, and a delay circuit 10b comprising transistors 16, 17, a capacitor 18, and a resistance 19. The input terminals A, B are respectively connected to bases of the transistors 11, 12, each of which have the same characteristics. Collectors of the transistors 11, 12 are respectively connected to a source voltage Vcc through the resistances 13, 14 of the same value, and emitters are connected together to a ground GND through the constant current source 15.

The transistor 16 is connected between the output terminal C and the source voltage Vcc, and the base of the transistor 16 is connected to the collector of the transistor 11. The capacitor 18 is connected between the output terminal C and the ground GND. Then, a charge part 10c is provided with the capacitor 18 and the transistor 16. A discharge part 10d comprising the transistor 17 and the resistance 19 which are further connected in series is connected between the output terminal C and the ground GND. The base of the transistor 17 is connected to the control terminal D.

Now, the delay inverting circuit 40, as shown in FIG. 2(b), is almost the same as the delay inverting circuit 10, and is provided with an inverting circuit 40a comprising transistors 41, 42, resistances 43, 44 and a constant current source 45, and a delay circuit 40b comprising transistors 46, 47a, 47b, a capacitor 48 and resistances 49a, 49b. Characteristics of the transistors 41, 42, 46, 47a are respectively the same as those of the transistors 11, 12, 16, 17. Values of the resistances 43, 44, 49a are respectively equal to those of the resistances 13, 14, 19. A value of the constant current source 15 is that of the constant current source 45, and a value of the capacitor 18 is that of the capacitor 48. Further, the transistor 47a, 47b and the resistances 49a, 49b connected in parallel in the discharge part 40d are respectively set at same values.

That is, the difference between the delay inverting circuit 40 and the delay inverting circuit 10 is that the impedance of the discharge part 40d in the delay inverting circuit 40 is a half of the impedance of the discharge part 10d in the delay inverting circuit 10.

Figure 3:
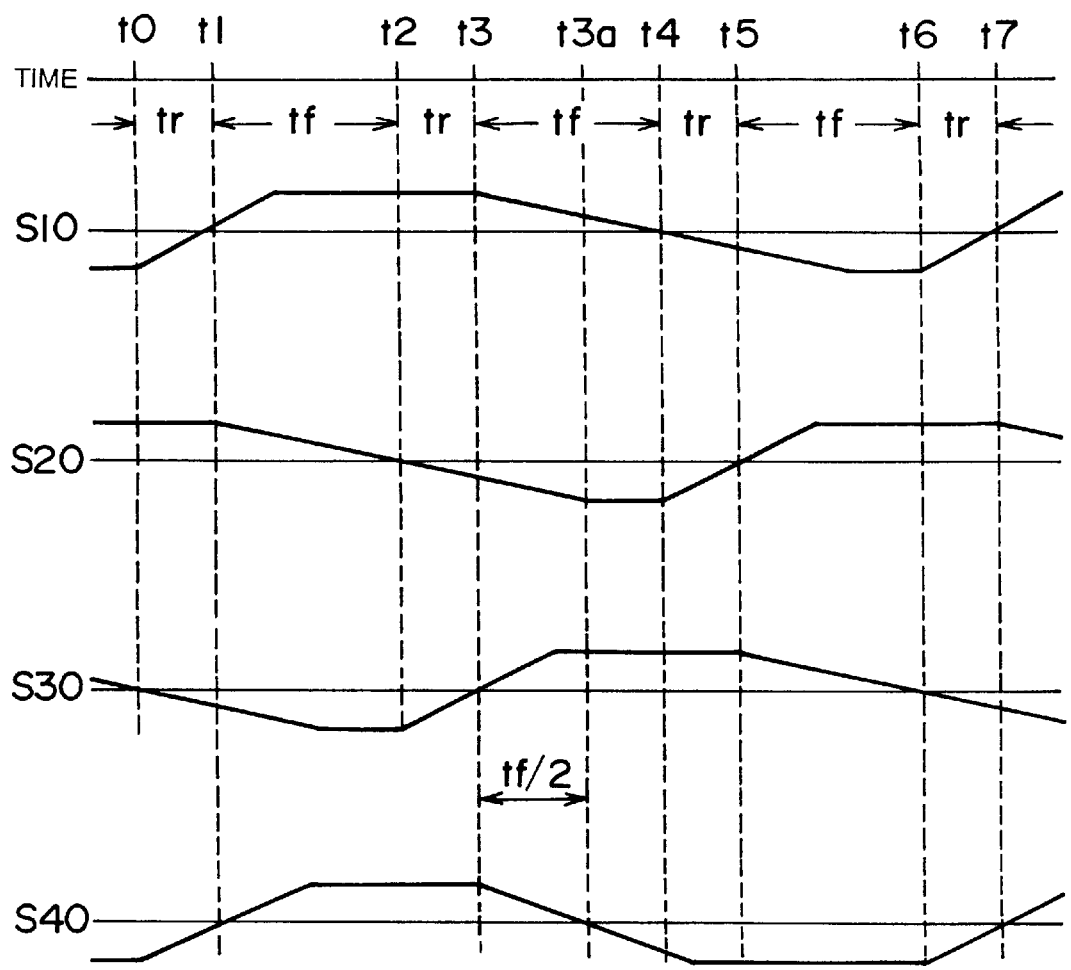
FIG. 3 is a view illustrating an operating waveform in the VCO in FIG. 1.

FIG. 3 is a view illustrating operating waveform of the respective delay inverting circuits 10–40 in the VCO shown in FIG. 1. An explanation will be given of the operation in the VCO shown in FIG. 1 with reference to FIGS. 2(a), 2(b) and 3.

Here, it is assumed that a half of the source voltage Vcc is applied to the input terminal B in each of the delay inverting circuits 10–40 as the reference voltage Vr, and the delay control voltage Vc within a predetermined range is applied to the control terminal D in common.

For example, at a time t0 in FIG.3, it is assumed that the output signal S30 from the delay inverting circuit 30 transitions from the "H" level to the "L" level. Since the output signal S30 is applied to the input terminal A, in the delay inverting circuit 10 shown in FIG. 2(a), the base voltage of the transistor 11 becomes lower than that of the transistor 12. The emitters of the transistors 11, 12 are connected together to the ground GND through the constant current source 15. Therefore, these are switched so that only one of them turns on. In this case, the transistor 11 is switched over from on to off, and the collector voltage of the transistor 11 raises to almost the source voltage Vcc. Then, the transistor 16 turns on, and the capacitor 18 is rapidly charged through the transistor 16. After a short delay time tr, at the time t1, the output signal S10 from the output terminal C becomes the "H" level.

At the time t1, when the output signal S10 from the delay inverting circuit 10 transitions from the "L" level to the "H"

level, the output signal S10 of the "H" level is applied to the input terminal A in the delay inverting circuit 20. The delay inverting circuit 20 is similar to the delay inverting circuit 10, therefore, the explanation is given of the operation in the delay inverting circuit 20 with reference to FIG. 2(a).

When the input terminal A becomes the "H" level, the transistor 11 turns on. Then, the collector voltage of the transistor 11 becomes the "L" level close to the level of the ground GND, and then the transistor 16 turns off. Thus, charges held in the capacitor 18 are discharged through the transistor 17 and the resistance 19 controlled by the delay control voltage Vc, and the output voltage reduces steadily in accordance with a time constant T10 determined by the capacity of the capacitor 18 and a composite resistance of the transistor 17 and the resistance 19. Then, after the delay time tf which is long relative to the time t1, the output signal S20 from the delay inverting circuit 20 becomes the "L" level. The delay time tf is determined in accordance with the continuity condition of the transistor 17. Therefore, it is possible to control the delay time tf with the delay control voltage Vc.

At a time t2, when the output signal S20 from the delay inverting circuit 20 transitions from the "H" level to the "L" level, the output signal S20 is applied to the input terminal A of the delay inverting circuit 30. Thus, in the delay inverting circuit 30, the operation which is similar to that of the delay inverting circuit 10 at the time t0 is carried out. Then, the output signal S30 from the delay inverting circuit 30 switches over from the "L" level to the "H" level at the time t3 after the delay time tr.

At a timet3, when the output signal S30 from the delay inverting circuit 30 transitions from the "L" level to the "H" level, the output signal S30 is applied to the input terminal A of the delay inverting circuit 10. Thus, in the delay inverting circuit 10, the operation which is similar to that of the delay inverting circuit 20 at the time t1 is carried out. Then, the output signal S10 from the delay inverting circuit 10 switches over from the "H" level to the "L" level at the time t4 after the delay time tf.

Likewise, the output signal S20 from the delay inverting circuit 20 switches over from the "L" level to the "H" level at the time t5 after the delay time tr from the time t4.

Further, the output signal S30 from the delay inverting circuit 30 switches over from the "H" level to the "L" level at the time t6 after the delay time tr from the time t5.

In this way, the inverting operation of the output signal S30 from the delay inverting circuit 30 is repeated in a cycle of a delay time (3tr+3tf) between the time t0 and the time t6.

Thus, a frequency FR30 and a duty cycle DT30 of the output signal S30 from the delay inverting circuit 30 are expressed as the following expressions (1) and (2):

$$FR30 = \frac{1}{3}(tr+tf) \qquad (1)$$

$$DT30 = (tr+2tf)/3(tr+tf) \qquad (2)$$

Here, if tr=0.2 ns and tf=1.6 ns,
FR30=185.2 MHz
DT30=62.9%.
If tr=0.2 ns and tf=4.0 ns,
FR30=79.4 MHz
DT30=65.1%.

On the contrary, at the time t0, when the output signal S30 from the delay inverting circuit 30 transition from the "H" level to the "L" level, the output signal S30 is applied to the input terminal A of the delay inverting circuit 40. Thus, in the delay inverting circuit 40 shown in FIG. 2(b), the base voltage of the transistor 41 becomes lower than that of the transistor 42. Since emitters of the transistors 41, 42 are connected together to the ground GND through the constant current source 45, these are switched so that only one of them turns on. In this case, the transistor 41 is switched over from on to off, and the collector voltage of the transistor 41 raises to almost the source voltage Vcc. Then, the transistor 46 turns on, and the capacitor 48 is rapidly charged through the transistor 46. After the delay time tr which is equal to that in the delay inverting circuit 10, at the time t1, the output signal S40 from the output terminal C becomes the "H" level.

At the time t3, when the output signal S30 from the delay inverting circuit 30 transitions from the "L" level to the "H" level, the input terminal A in the delay inverting circuit 40 become the "H" level and the transistor 41 switches over to on. Then, the collector voltage of the transistor 41 becomes the "L" level close to the voltage of the ground GND, and then the transistor 46 turns off. Thus, charges held in the capacitor 48 are discharged through a parallel circuit comprising the transistor 47a and the resistance 49a and the transistor 47b and the resistance 49b, and the voltage at the output terminal C reduces steadily in accordance with a time constant T40 determined by the capacity of the capacitor 48 and composite resistances of the transistors 47a, 47b and the resistances 49a, 49b.

The capacitors 19, 49, the transistors 17, 47a, 47b and the resistances 18, 48a, 48b are respectively set at the same capacity, the same characteristics and the same resistance value. Therefore, the time constant T40 in the delay inverting circuit 40 becomes a half of the time constant T10 in the delay inverting circuit 10. Thus, after the delay time tf/2 from the time t3, at a time t3.5, the output signal S40 from the delay inverting circuit 40 becomes the "L" level.

Thus, a frequency FR40 and a duty cycle DT40 of the output signal S40 from the delay inverting circuit 40 are expressed as the following expressions (3) and (4):

$$FR40 = 1/3(tr+tf) \qquad (3)$$

$$DT40 = (tf+tr+tf/2)/3(tf+tr) \qquad (4)$$
$$= 0.5 - tr/6(tf+tr).$$

Here, if tr=0.2 ns and tf=1.6 ns,
FR40=185.2 MHz
DT40=45.8%.
If tr=0.2 ns and tf=4.0 ns,
FR40=79.4 MHz
DT40=49.2%.

In this way, the delay times are set to be tr<<tf, whereby it is possible to keep the duty cycle DT40 at almost 50%.

As described above, in the VCO of this embodiment, the delay inverting circuits 10–30 which form a ring circuit is provided with the delay inverting circuit 40 of which the delay time is a half of that in the delay inverting circuits 10–30 so that the oscillating output is obtained. Thus, it is possible to obtain a duty cycle of almost 50% compared with a case that an oscillating output is obtained from the delay inverting circuit 30.

That is, since a number of stages in a ring oscillating circuit does not vary, it is possible to obtain an oscillating signal OUT of which the duty cycle is almost 50% without reducing a oscillating frequency.

<Second Embodiment>

Figure 4:
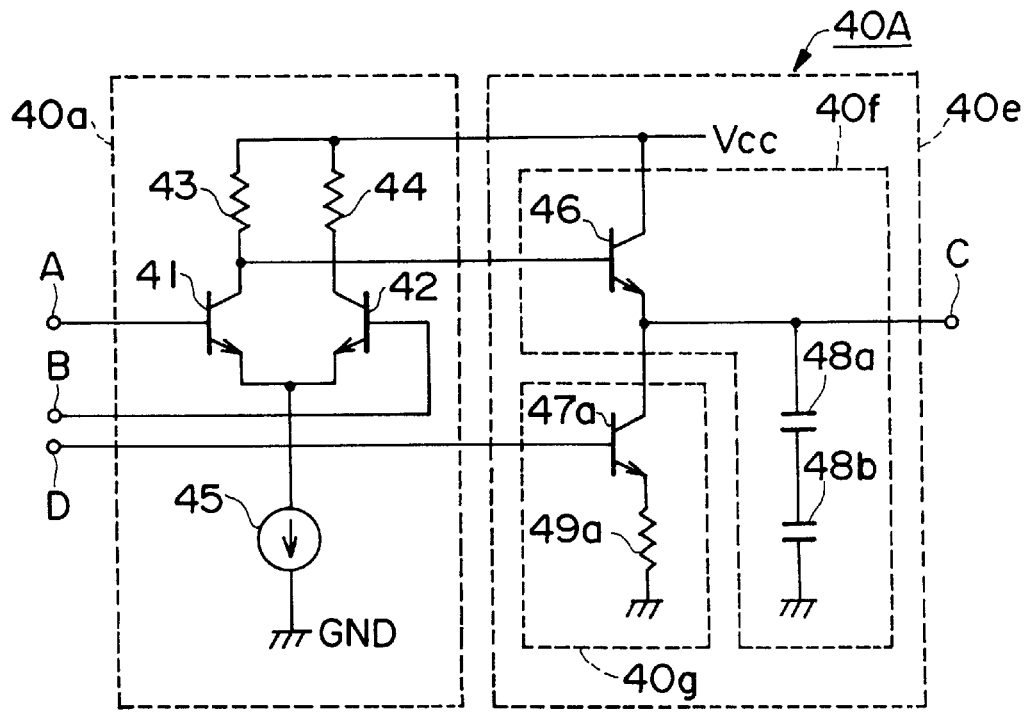
FIG. 4 is a circuit view illustrating a delay inverting circuit 40A in a VCO of the second embodiment according to the present invention.

FIG. 4 is a view illustrating a delay inverting circuit 40A in a VCO of the second embodiment according to the present invention. In FIG. 4, the same numerals are used for the same elements in FIG. 2(b).

The delay inverting circuit 40A is arranged instead of the delay inverting circuit 40 in FIG. 1. The differences from the delay inverting circuit 40 shown in FIG. 2(b) are that a charge part 40f comprising a series circuit of capacitors 48a, 48b each having a capacity that is equal to that of the capacitor 48 is provided instead of the charge part 40c, and a discharge part 40g is provide in which the transistor 47a and the resistance 49b are removed instead of the discharge part 40d.

With this arrangement, though the capacity of the charge part 40f becomes ½ and the impedance of the discharge part 40g becomes double, the time constant is equal to that in the first embodiment. Thus, the operation similar to the first embodiment is carried out, and then it is possible to obtain the same effects.

<Third Embodiment>

Figure 5:
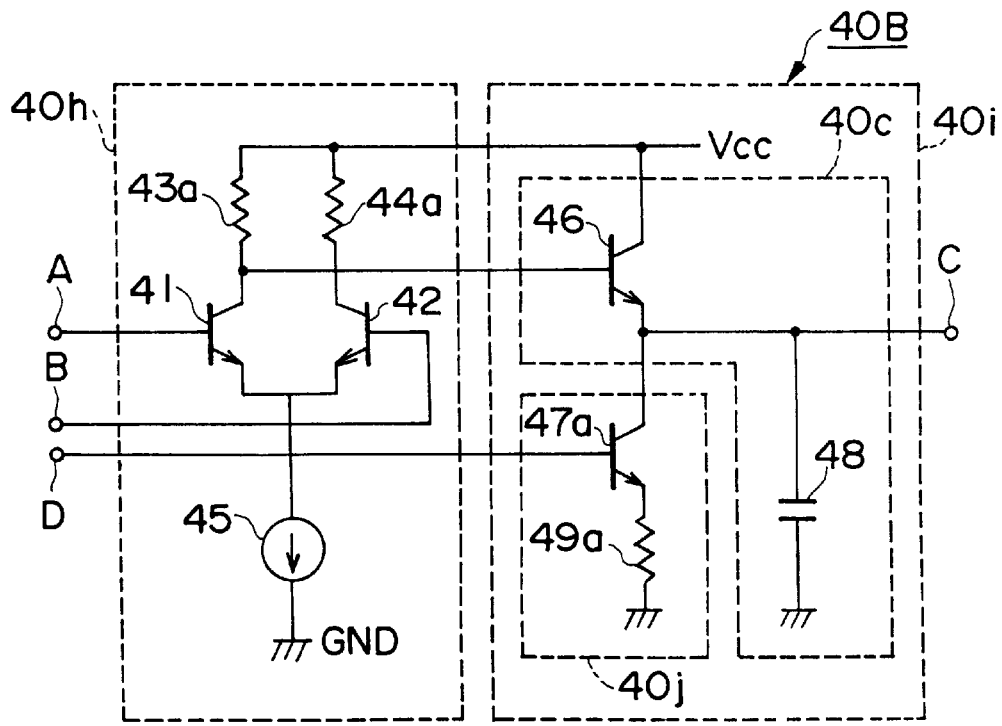
FIG. 5 is a circuit view illustrating a delay inverting circuit 40B in a VCO of the third embodiment according to the present invention.
Figure 6:
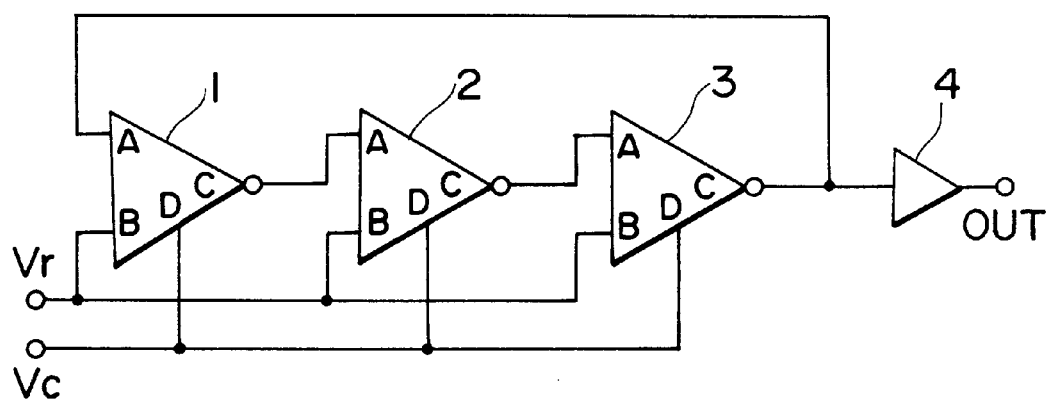
FIG. 6 is a structural view illustrating a conventional VCO.

FIG. 5 is a view illustrating a delay inverting circuit 40B in a VCO of the third embodiment according to the present invention. In FIG. 5, the same numerals are used for the same elements in FIG. 2(b).

The delay inverting circuit 40B is arranged instead of the delay inverting circuit 40 in FIG. 1. The differences from the delay inverting circuit 40 shown in FIG. 2(b) are that an inverting circuit 40h comprising resistances 43a, 44a having values that are ½ of those of the resistances 43, 44 in the inverting circuit 40a is arranged and a discharge part 40j is provide in which the transistor 47b and the resistor 49b of the discharge part 40d are removed.

With this arrangement, the voltage difference between the "L" and "H" levels generated by the inverting circuit 40h in the delay inverting circuit 40B corresponds to a product of the value of the resistance 43a and the current value of the constant current source 45, therefore, the voltage difference is a half of voltage difference between the "L" and "H" levels generated by the inverting circuit 10a in the delay inverting circuit 10. Since the charge part 40c is charged by the output voltage from the inverting circuit 40h, charges held by the capacitor 48 in the discharge part 40c are a half of those held by the capacitor 18 in the delay inverting circuit 10. Thus, it is possible for the discharge part 40j in the delay inverting circuit 40B to discharge the capacitor 48 for a half of the time which is taken for the discharge part 10d in the delay inverting circuit 10. That is, since the delay inverting circuit 40B shown in FIG. 5 operates similarly to the delay inverting circuit 40 in FIG. 2(b), there are the same effects as the first embodiment.

Additionally, the present invention is not limited to the above described embodiments, and can be modified in various ways. For example, there are modifications contemplated as follows.

(a) The ring oscillating circuit in FIG. 1 comprises three stages; however, a ring oscillating circuit comprising an odd number of stages not less than three operates similarly. Thus, a number of stages may be set in accordance with a desired oscillating frequency.

(b) The reference voltage Vr is applied to each of the input terminals B of the delay inverting circuits 10–40 in those embodiment; however, it is not always necessary to apply the reference voltage Vr from the outside. Thus, the reference voltage Vr may be produced in each of the delay inverting circuits 10–40.

(c) Each of the delay inverting circuits 10–40 comprises bipolar transistors; however, it may be a CMOS (Complementary Metal Oxide Semiconductor) gate circuit comprising MOS (Metal Oxide Semiconductor) transistors or the like.

(d) Circuit structures and constants of the charge part 40c and the discharge part 40d in the delay circuit 40b are not limited to having the values assigned in those exemplary embodiment. Therefore, any combination of values may be used as long as a time constant during discharge is a half of that in the delay inverting circuit 10 or the like.

(e) The delay inverting circuit 10 or the like is not limited to the circuit shown in FIGS. 2(a) and 2(b); Therefore, any circuit may be used as long as the logical value of the input signal is inverted and the delay time is controlled by the delay control voltage Vc.

As explained above in detail, each of the first-fifth aspects is provided with the second delay circuit of which a delay time from the second logical level to the first logical level is shortened to a half of that in the first delay circuit. Then, the second inverting circuit and the second delay circuit correct the duty cycle of the oscillating signal generated by the second delay circuit. Therefore, it is possible to keep the duty cycle of the oscillating signal generated by the second delay circuit at almost 50%.

The sixth aspect is provided by a second inverting circuit which inverts the logical level of the output signal from the ring oscillating circuit and of which the output amplitude is restricted to a half of that of the signal provided to the VCO. The second delay circuit generates a signal which is delayed in accordance with a variation of the logical level within the output amplitude which is ½ of that of the signal. Therefore, a delay time from the fourth logical level to the third logical level is shortened to a half of that from the second logical level to the first logical level. Thus, it is possible to keep the duty cycle of the oscillating signal at almost 50%, similarly to the first-third aspects.

This invention being thus described, it will be obvious that the same may be varied in various ways. Such variations are not to be regarded as departures from the spirit and scope of the invention, and all such modifications would be obvious for one skilled in the art as intended to be included within the scope of the following claims.

What is claimed is:

1. A voltage controlled oscillator comprising an even number of delay inverting circuits, wherein the even number is at least four, and controlling an oscillating frequency, each of the delay inverting circuits comprising:

an input terminal for receiving an input signal having a level that is within a predetermined range;

a reference terminal for receiving a reference signal of a value that is within the predetermined range;

a control terminal for receiving a control signal;

an inverting circuit for inverting the input signal to produce an inverted signal having a level that is one of a first logic level and a second logic level based on whether the level of the input signal exceeds the reference signal or not; and a delay circuit for receiving the inverted signal and generating a delay signal having a level that changes at a constant rate within the predetermined range when the input signal is inverted from the first logic level to the second logic level;

wherein one of the delay inverting circuits of a last stage generates a final delay signal having a level that changes at a rate that is half of a variable rate within the predetermined range in accordance with the control signal, when the input signal is inverted from the second logic level to the first logic level, and others of the delay inverting circuits are connected in a ring and respectively generate the delay signal having a level that changes at the variable rate within the predetermined range in accordance with the control signal when the input signal is inverted from the second logic level to the first logic level.

2. A voltage controlled oscillator according to claim 1, wherein said delay circuit in each of said delay inverting circuits connected in the ring comprises a first charge part which is filled with electric charges by the inverted signal of the second logic level and which generates the delay signal that changes at the constant rate, and a first discharge part which is controlled by the control signal and which discharges the electric charges filled in the first charge part in accordance with the control signal when the inverted signal is the first logic level.

3. A voltage controlled oscillator according to claim 2, wherein said delay circuit in the one delay inverting circuits of the last stage comprises a second charge part which is filled with electric charges by the inverted signal of the second logic level and which generates the delay signal that changes at one of the constant rate and a half of the variable rate, and a second discharge part which is controlled by the control signal and which discharges the electric charges filled in the second charge part in accordance with the control signal when the inverted signal is the first logic level.

4. A voltage controlled oscillator according to claim 3, wherein a capacity of said second charge part is equal to a capacity of said first charge part, and said second discharge part discharges the electric charges in said second charge part at twice a speed that said first discharge part discharges the electric charges in said first charge part.

5. A voltage controlled oscillator according to claim 3, wherein a capacity of said second charge part is a half of a capacity of said first charge part, and said second discharge part discharges the electric charges in said second charge part at a speed equal to a speed that said first discharge part discharges the electric charges in said first charge part.

6. A voltage controlled oscillator comprising an even number of delay inverting circuits, wherein the even number is at least four, and controlling an oscillating frequency, each of the delay inverting circuits comprising:

an input terminal for receiving an input signal having a level that is within a predetermined range;

a reference terminal for receiving a reference signal of a value that is within the predetermined range;

a control terminal for receiving a control signal;

wherein one of the delay inverting circuits of a last stage comprises a first inverting circuit for inverting the input signal to produce an inverted signal having a level that is one of a first logic level and a second logic level within a half of the predetermined range based on whether the level of the input signal exceeds the reference signal or not, and a first delay circuit for receiving the inverted signal and generating a delay signal having a level that changes at a constant rate within the half of the predetermined range when the input signal is inverted from the first logic level to the second logic level and generating a delay signal having a level that changes at a variable rate within the half of the predetermined range in accordance with the control signal when the input signal is inverted from the second logic level to the first logical level; and each of others of the delay inverting circuits is connected in a ring and comprises a second inverting circuit for inverting the input signal to produce an inverted signal having a level that is one of a third logic level and a fourth logic level within the predetermined range based on whether the level of the input signal exceeds the reference signal or not, and a second delay circuit for receiving the inverted signal and generating a delay signal having a level that changes at the constant rate within the predetermined range when the signal is inverted from the third logic level to the fourth logic level and generating a delay signal having a level that changes at the variable rate within the predetermined range in accordance with the control signal when the input signal is inverted from the fourth logic level to the third logic level.

7. A method of controlling a voltage controlled oscillator comprising a ring oscillator provided with an odd number of delay inverting circuits, wherein the odd number is at least three, and a delay inverter connected to the ring oscillator, said method comprising:

receiving an input signal having a level within a range;

receiving a reference signal having a value within the range;

receiving a control signal;

inverting the input signal to produce an inverted signal having a level that is one of a first logic level and a second logic level within the range based on whether the level of the input signal exceeds the reference signal in the ring oscillator;

receiving the inverted signal;

generating a delay signal having a level that changes at a constant rate within the range in the ring oscillator when the input signal is inverted from the first logic level to the second logic level and of generating a delay signal having a level that changes at a variable rate within the range in accordance with the control signal in the ring oscillator when the input signal is inverted from the second logic level to the first logic level;

receiving the delay signal generated by the ring oscillator and inverting the delay signal between the first logic level and the second logic level based on whether the level of the input signal exceeds the reference signal in the delay inverter; and generating an output signal having a level that changes at the constant rate within the range when the input signal is inverted from the first logic level to the second logic level, and generating an output signal having a level that changes at a half of the variable rate within the range in accordance with the control signal when the input signal is inverted from the second logic level to the first logic level.

* * * * *